US011018677B1

(12) United States Patent
Jung

(10) Patent No.: US 11,018,677 B1
(45) Date of Patent: May 25, 2021

(54) TRANSMISSION ENABLE SIGNAL GENERATION CIRCUIT AND INTEGRATED CIRCUIT

(71) Applicant: SK hynix Inc., Gyeonggi-do (KR)

(72) Inventor: Inhwa Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/848,541

(22) Filed: Apr. 14, 2020

(30) Foreign Application Priority Data

Dec. 23, 2019 (KR) .................. 10-2019-0173275

(51) Int. Cl.
| | |
|---|---|
| *G06F 1/04* | (2006.01) |
| *H03L 7/08* | (2006.01) |
| *H04L 7/00* | (2006.01) |
| *H03L 7/081* | (2006.01) |
| *G06F 1/10* | (2006.01) |
| *H03L 7/087* | (2006.01) |
| *H04L 7/033* | (2006.01) |

(52) U.S. Cl.
CPC .............. *H03L 7/0814* (2013.01); *G06F 1/10* (2013.01); *H03L 7/087* (2013.01); *H04L 7/0337* (2013.01)

(58) Field of Classification Search
CPC ..... H03L 7/0812; H03L 7/081; H03L 7/0814; H03L 7/087; H04L 7/0337; H04L 7/0338; G06F 1/04; G06F 1/06; G06F 1/10; G06F 1/0321; G06F 1/0342
See application file for complete search history.

(56) References Cited

U.S. PATENT DOCUMENTS

| | | | | |
|---|---|---|---|---|
| 4,977,582 A * | 12/1990 | Nichols | ................ | H04L 7/0338 370/517 |
| 5,022,056 A * | 6/1991 | Henderson | ............ | H04L 7/0338 327/141 |
| 6,933,758 B2 * | 8/2005 | Kim | ........................ | H03L 7/087 327/161 |
| 6,980,042 B2 * | 12/2005 | LaBerge | .................... | G06F 1/12 327/141 |
| 8,976,596 B1 | 3/2015 | Yamamoto et al. | | |
| 9,859,892 B2 * | 1/2018 | Cho | ............... | H03K 19/018521 |

FOREIGN PATENT DOCUMENTS

KR        10-0541806        1/2006

* cited by examiner

*Primary Examiner* — An T Luu
(74) *Attorney, Agent, or Firm* — IP & T Group LLP

(57) ABSTRACT

An integrated circuit which adjusts a period for enabling a transmitter, and includes a data delay circuit delaying data to generate transmission data; a transmission/reception terminal; a receiver receiving reception data transferred to the transmission/reception terminal, in response to a reception enable signal; a transmitter transmitting the transmission data to the transmission/reception terminal in response to a transmission enable signal; a shift circuit generating a plurality of preliminary transmission enable signals by sequentially delaying a signal; a phase comparison circuit comparing a phase of each of the plurality of preliminary transmission enable signals and a phase of the transmission data; and a selection circuit selecting one of the plurality of preliminary transmission enable signals as a transmission enable signal according to a phase comparison result of the phase comparison circuit. Since only one phase comparison circuit is used, a circuit area for generating the transmission enable signal may be reduced.

9 Claims, 4 Drawing Sheets

TRANSMISSION ENABLE SIGNAL GENERATION CIRCUIT AND INTEGRATED CIRCUIT

CROSS-REFERENCE TO RELATED APPLICATION

This application claims priority under 35 U.S.C. § 119 to Korean Patent Application No. 10-2019-0173275 filed on Dec. 23, 2019, which is incorporated herein by reference in its entirety.

BACKGROUND

1. Field

Various embodiments of the present invention relate to a transmitter used for transmitting data (signals) in various integrated circuits.

2. Discussion of the Related Art

Various integrated circuit chips operate by exchanging signals (data) with peripheral chips rather than alone. For example, memory chips such as DRAM and Flash memory exchange data with a memory controller. Moreover, a CPU also exchanges data with various chips on a motherboard.

Bidirectional transmission lines are mainly used for transmitting/receiving data. When an integrated circuit A and an integrated circuit B transmit/receive data by using the bidirectional transmission line, the integrated circuit A includes a transmitter and a receiver electrically connected to the transmission line, and the integrated circuit B includes a transmitter and a receiver electrically connected to the transmission line. Since operation periods of the transmitter and the receiver disposed in substantially the same integrated circuit need to be clearly distinguished from each other, a technology for clearly distinguishing the operation periods is required.

SUMMARY

Various embodiments are directed to accurately adjusting a period for enabling a transmitter.

In an embodiment, a transmission enable signal generation circuit may include: a shift circuit suitable for generating a plurality of preliminary transmission enable signals by sequentially delaying a signal; a phase comparison circuit suitable for comparing a phase of each of the plurality of preliminary transmission enable signals and a phase of transmission data; and a selection circuit suitable for selecting one of the plurality of preliminary transmission enable signals as a transmission enable signal according to a phase comparison result of the phase comparison circuit.

In another embodiment, a transmission enable signal generation circuit may include: a shift circuit suitable for generating a plurality of preliminary transmission enable signals by sequentially delaying a signal; a selector suitable for selecting one of the plurality of preliminary transmission enable signals as a transmission enable signal in response to a selection code; a phase comparison circuit suitable for comparing a phase of the transmission enable signal with a phase of transmission data; and a selection code generator suitable for generating the selection code in response to a phase comparison result of the phase comparison circuit.

In an embodiment, an integrated circuit may include: a data delay circuit suitable for delaying data to generate transmission data; a transmission/reception terminal; a receiver suitable for receiving reception data, which is transferred to the transmission/reception terminal, in response to a reception enable signal; a transmitter suitable for transmitting the transmission data to the transmission/reception terminal in response to a transmission enable signal; a shift circuit suitable for generating a plurality of preliminary transmission enable signals by sequentially delaying a signal; a phase comparison circuit suitable for comparing a phase of each of the plurality of preliminary transmission enable signals and a phase of the transmission data; and a selection circuit suitable for selecting one of the plurality of preliminary transmission enable signals as a transmission enable signal according to a phase comparison result of the phase comparison circuit.

In another embodiment, an integrated circuit may include: a data delay circuit suitable for delaying data to generate transmission data; a transmission/reception terminal; a receiver suitable for receiving reception data, which is transferred to the transmission/reception terminal, in response to a reception enable signal; a transmitter suitable for transmitting the transmission data to the transmission/reception terminal in response to a transmission enable signal; a shift circuit suitable for generating a plurality of preliminary transmission enable signals by sequentially delaying a signal; a selector suitable for selecting one of the plurality of preliminary transmission enable signals as the transmission enable signal in response to a selection code; a phase comparison circuit suitable for comparing a phase of the transmission enable signal with a phase of the transmission data; and a selection code generator suitable for generating the selection code in response to a phase comparison result of the phase comparison circuit.

In accordance with the embodiments, it is possible to accurately adjust a period for enabling a transmitter.

These and other features and advantages of the present disclosure will become apparent to those skilled in the art of the invention from the following detailed description in conjunction with the following drawings.

DETAILED DESCRIPTION

Figure 1:
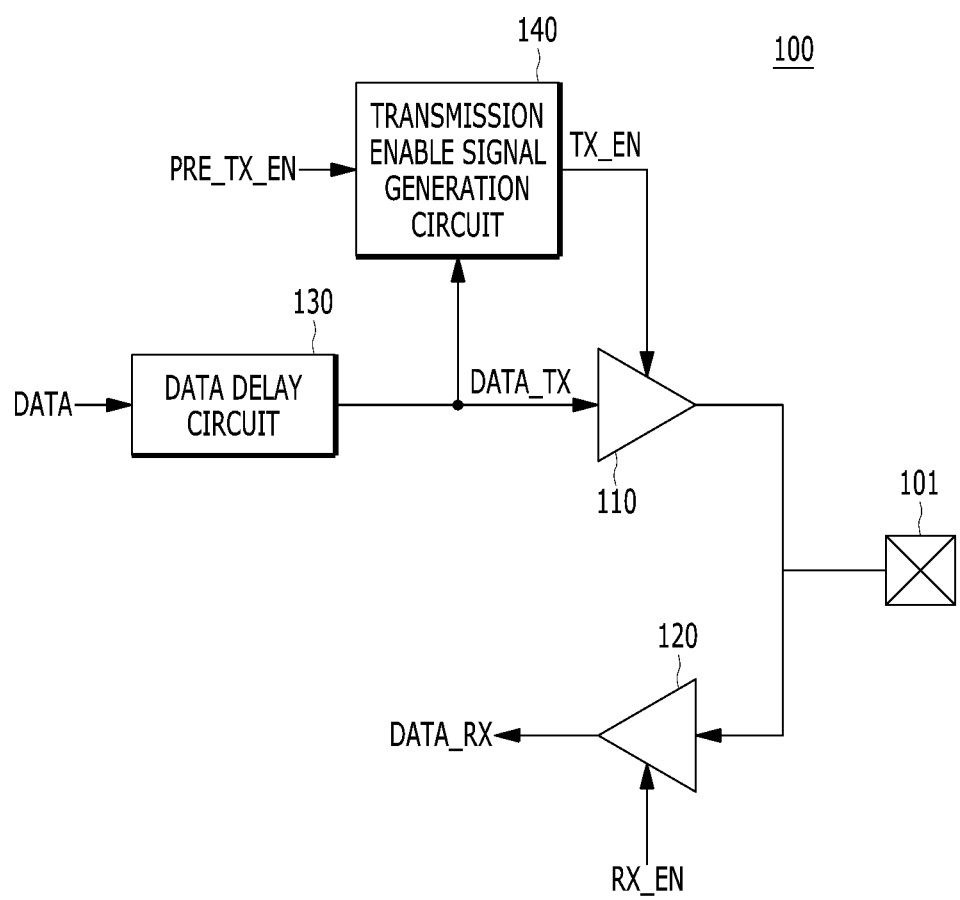
FIG. 1 is a configuration diagram illustrating an integrated circuit 100 in accordance with various embodiments of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Throughout the specification, when one element is referred to as being 'connected to' or 'coupled to' another element, it may indicate that the former element is directly connected or coupled to the latter element, or electrically connected or coupled to the latter element with another element interposed therebetween. Furthermore, when an element "includes" or "comprises" a component, it means that the element does not exclude another component but may further include or comprise another component, unless referred to the contrary. Moreover, although components described in the specification are represented in the singular form, the present embodiment is not limited thereto, but the corresponding components may also be represented in a plural form.

FIG. 1 is a configuration diagram of an integrated circuit 100 in accordance with various embodiments of the present invention.

Referring to FIG. 1, the integrated circuit 100 may include a transmission/reception terminal 101, a transmitter 110, a receiver 120, a data delay circuit 130, and a transmission enable signal generation circuit 140.

The transmitter 110 may transmit transmission data DATA_TX to the transmission/reception terminal 101. The receiver 120 may receive reception data DATA_RX from the transmission/reception terminal 101. The transmitter 110 may be enabled in response to a transmission enable signal TX_EN and the receiver 120 may be enabled in response to a reception enable signal RX_EN. When the transmitter 110 and the receiver 120 are enabled at the same time, the receiver 120 can immediately receive data transmitted by the transmitter 110. Accordingly, in some cases, the transmitter 110 and the receiver 120 may not need to be enabled at the same time. That is, the transmission enable signal TX_EN may be a signal that is enabled during a period in which the integrated circuit 100 transmits data, and the reception enable signal RX_EN may be a signal that is enabled during a period in which the integrated circuit 100 receives data.

The transmission/reception terminal 101 may be a terminal through which the integrated circuit 100 transmits/receives data to/from another integrated circuit, and a transmission line (not illustrated) electrically connected to a transmission/reception terminal of the other integrated circuit may be electrically connected to the transmission/reception terminal 101.

The data delay circuit 130 may delay data DATA to generate the transmission data DATA_TX. The data delay circuit 130 may delay the data DATA in order to comply with latency rules related to data transmission. For example, when the integrated circuit 100 is a memory, a delay of data may be needed to maintain a latency related to an output time point of data such as read latency. The area and current consumption of the data delay circuit 130 may increase depending on the size of a delay value required by a system including the integrated circuit 100 and complicated system regulations related to data delay.

The transmission enable signal generation circuit 140 may make use of a signal PRE_TX_EN to generate the transmission enable signal TX_EN. The signal PRE_TX_EN may be enabled in a period in which the data DATA is valid. Since the data DATA is delayed by the data delay circuit 130, the signal PRE_TX_EN also needs to be delayed to correspond with the delay of the data DATA. Substantially the same circuit as the data delay circuit 130 may be further used to delay the signal, but the data delay circuit 130 may be a large burden due to its large area and high current consumption. The transmission enable signal generation circuit 140 may generate the transmission enable signal TX_EN in a manner of retiming the signal PRE_TX_EN according to the transmission data DATA_TX.

Figure 2:
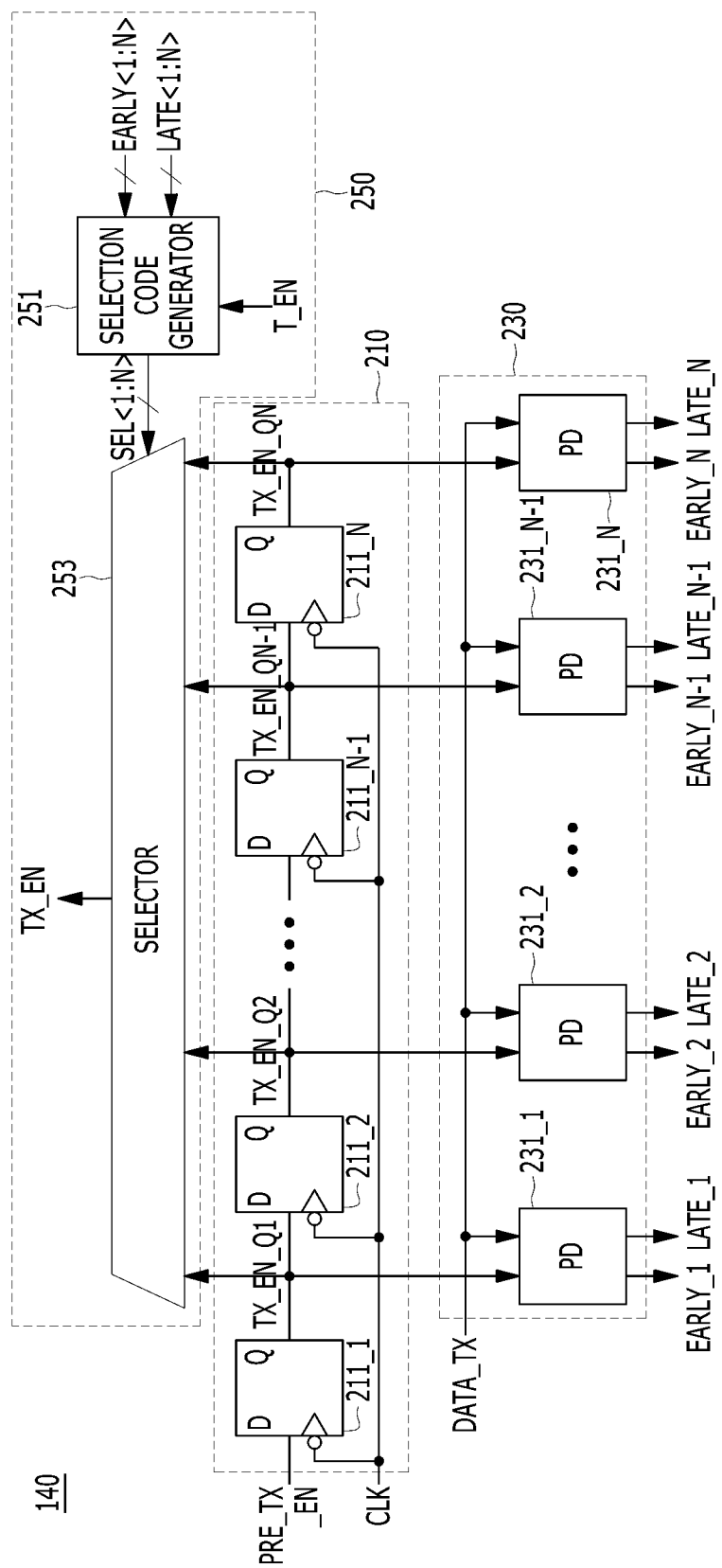
FIG. 2 is a configuration diagram illustrating a transmission enable signal generation circuit 140 of FIG. 1 in accordance with various embodiments of the present invention.

FIG. 2 is a configuration diagram illustrating the transmission enable signal generation circuit 140 of FIG. 1.

Referring to FIG. 2, the transmission enable signal generation circuit 140 may include a shift circuit 210, a phase comparison circuit 230, and a selection circuit 250.

The shift circuit 210 may sequentially delay the signal PRE_TX_EN to generate a plurality of preliminary transmission enable signals TX_EN_Q1 to TX_EN_QN. The shift circuit 210 may include a plurality of D flip-flops 211_1 to 211_N connected in series to one another (N is an arbitrary integer equal to or more than 2). Each of the D flip-flops 211_1 to 211_N may sequentially delay the signal PRE_TX_EN in synchronization with a falling edge of a clock CLK. For example, the D flip-flop 211_3 may delay TX_EN_Q2 to generate TX_EN_Q3. Bubbles of clock terminals of the D flip-flops 211_1 to 211_N may indicate that the D flip-flops 211_1 to 211_N operate in synchronization with the falling edge of the clock CLK. Although in the embodiment described herein the shift circuit 210 includes the plurality of D flip-flops 211_1 to 211_N connected in series to one another and sequentially delays the signal PRE_TX_EN by using the D flip-flops 211_1 to 211_N, this description is for illustrative purposes and other types of delay elements connected in series to one another, other than the D flip-flops 211_1 to 211_N, may also be used.

The phase comparison circuit 230 may compare a phase of each of the preliminary transmission enable signals TX_EN_Q1 to TX_EN_QN and a phase of the transmission data DATA_TX. The phase comparison circuit 230 may include a plurality of phase comparators 231_1 to 231_N. Each of the phase comparators 231_1 to 231_N may compare the phase of a corresponding signal of the preliminary transmission enable signals TX_EN_Q1 to TX_EN_QN, with the phase of the transmission data DATA_TX. Each of the phase comparators 231_1 to 231_N may enable an early signal EARLY when the phase of the corresponding preliminary transmission enable signal, is earlier than the phase of the transmission data DATA_TX, and may enable a late signal LATE when the phase of the corresponding preliminary transmission enable signal, is later than the phase of the transmission data DATA_TX.

The selection circuit 250 may select one of the preliminary transmission enable signals TX_EN_Q1 to TX_EN_QN as the transmission enable signal TX_EN in response to the phase comparison result EARLY_1 to EARLY_N and LATE_1 to LATE_N of the phase comparison circuit 230. The selection circuit 250 may include a selection code generator 251 and a selector 253.

The selection code generator 251 may generate selection codes SEL<1:N> by using the phase comparison result EARLY_1 to EARLY_N and LATE_1 to LATE_N of the phase comparison circuit 230. When EARLY_K is 'H' and LATE_K+1 is 'H', the selection code generator 251 may generate the selection codes SEL<1:N> such that the preliminary transmission enable signal TX_EN_QK can be selected as the transmission enable signal TX_EN. For example, when EARLY_1 is 'H', EARLY_2 is 'H', EARLY_3 is 'H', LATE_4 is 'H', LATE_5 is 'H' . . . , the selection code generator 251 may generate the selection codes SEL<1:N> such that the preliminary transmission enable signal TX_EN_Q3 can be selected as the transmission enable signal TX_EN. The selection code generator 251 may be enabled to generate the selection codes SEL<1:N> during a training operation period in which a training enable signal T_EN is enabled. Further, the selection code generator 251 may be disabled when the training enable signal T_EN is disabled. The selection code generator 251 may hold the generated selection codes SEL<1:N> when it is disabled. That is, when the training operation ends, the selection code generator 251 may hold the selection codes SEL<1:N> generated during the training operation without performing additional selection operations.

The selector 253 may select one of the preliminary transmission enable signals TX_EN_Q1 to TX_EN_QN in response to the selection codes SEL<1:N> and output the selected preliminary transmission enable signal as the transmission enable signal TX_EN.

Figure 3:
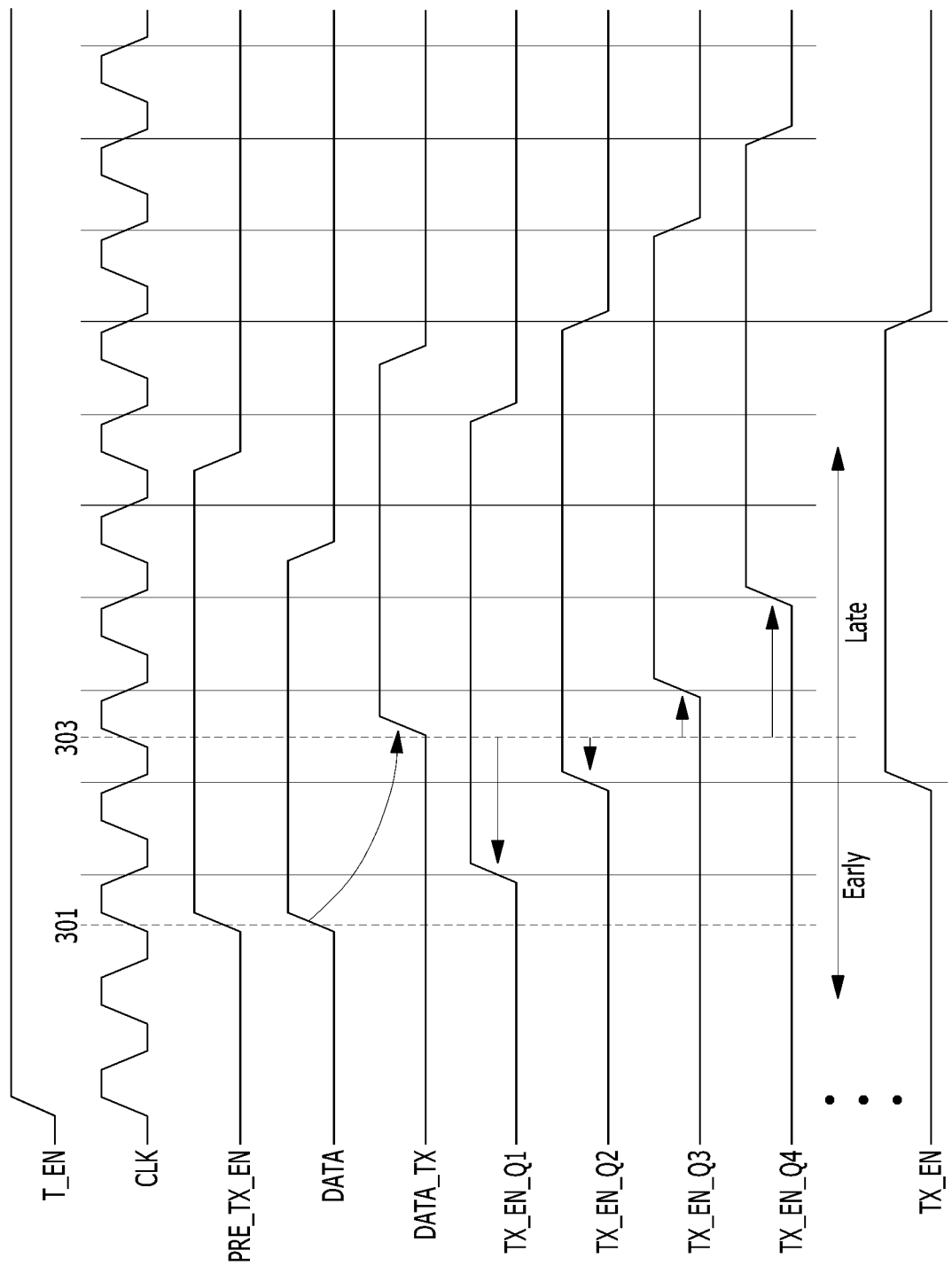
FIG. 3 is a timing diagram illustrating an operation of the transmission enable signal generation circuit 140 of FIG. 2 in accordance with various embodiments of the present invention.

FIG. 3 is a timing diagram illustrating the operation of the transmission enable signal generation circuit 140 of FIG. 2.

Referring to FIG. 3, when the training enable signal T_EN is enabled to 'H', the training operation may be initiated.

During the training operation, the data DATA may have a value of 'H' from the time point '301'. In general, since two pieces of data DATA are transferred per one cycle of the clock CLK, FIG. 3 may show that eight pieces of 'H' data are output. Originally, the data DATA may have various patterns, but may be substantially maintained at 'H' for ease of training during the training operation. Similarly, the signal PRE_TX_EN may be enabled to 'H' from the time point '301'. For margin, the enable period of the signal PRE_TX_EN may be slightly longer than a period in which valid data DATA exists.

The data delay circuit 130 may delay the data DATA to generate the transmission data DATA_TX. The transmission data DATA_TX generated by delaying the data DATA may have a value of 'H' from the time point '303'.

The shift circuit 210 may sequentially delay the signal PRE_TX_EN to generate the preliminary transmission enable signals TX_EN_Q1 to TX_EN_QN. In FIG. 3, it can be seen that the phases of the preliminary transmission enable signals TX_EN_Q1 and TX_EN_Q2 are earlier than the phase of the transmission data DATA_TX, and the phases of the preliminary transmission enable signals TX_EN_Q3 to TX_EN_QN are later than the phase of the transmission data DATA_TX. Accordingly, the phase comparison circuit 230 may generate a phase comparison result of EARLY_1='H', EARLY_2='H', LATE_3='H', LATE_4='H' . . . . .

The selection circuit 250 may select the preliminary transmission enable signal TX_EN_Q2, which has a smaller phase difference with the transmission data DATA_TX, between the preliminary transmission enable signals TX_EN_Q1 and TX_EN_Q2 with phases earlier than the phase of the transmission data DATA_TX, as the transmission enable signal TX_EN.

It can be seen that the transmission enable signal TX_EN is enabled during a period slightly larger than a period in which the transmission data DATA_TX is valid. As a consequence, when the transmission data DATA_TX is output by enabling the transmitter 110 during the period in which the transmission enable signal TX_EN is enabled, it is possible to perform a stable operation.

Figure 4:
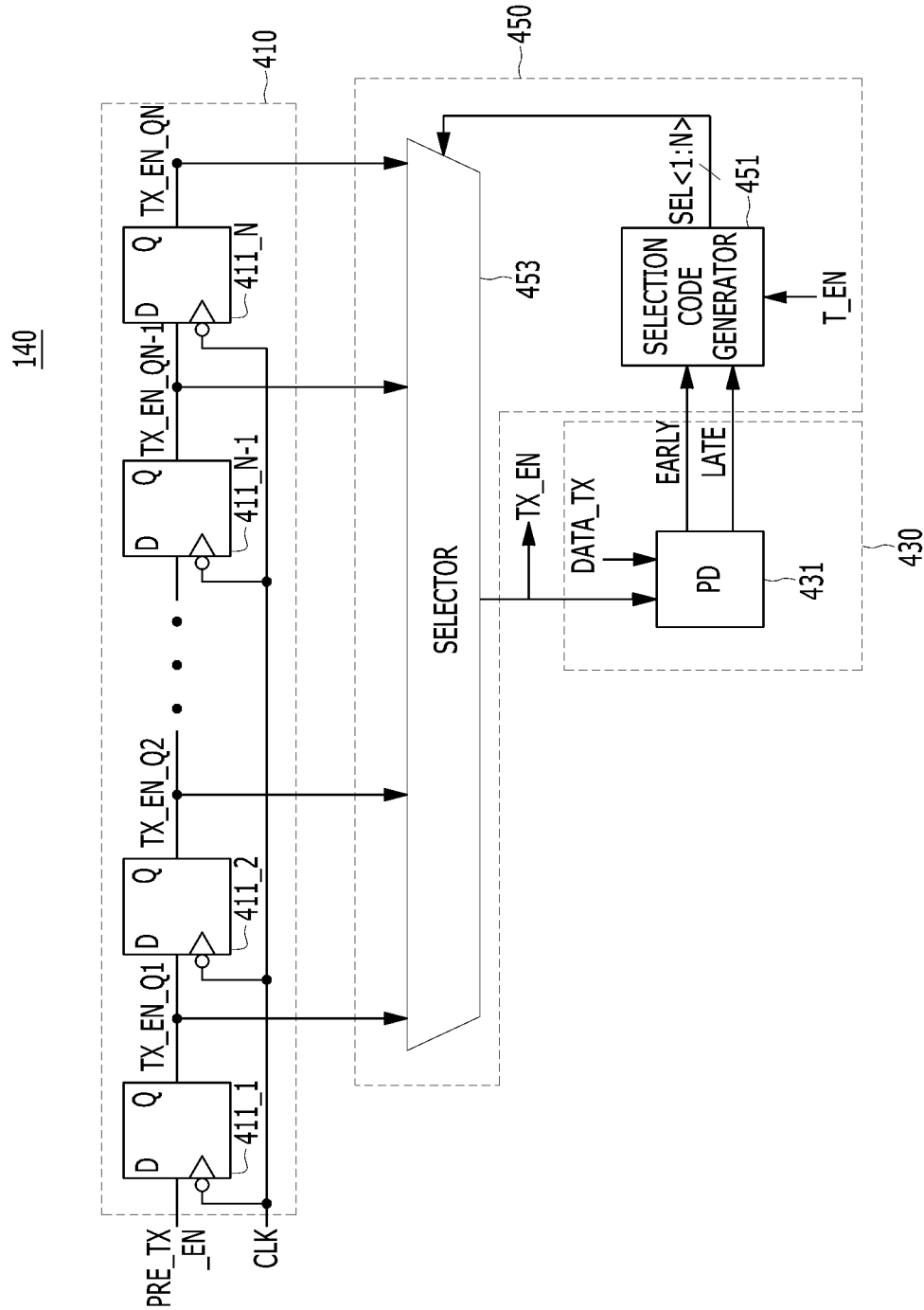
FIG. 4 is another configuration diagram illustrating the transmission enable signal generation circuit 140 of FIG. 1 in accordance with various embodiments of the present invention.

FIG. 4 is another configuration diagram illustrating the transmission enable signal generation circuit 140 of FIG. 1.

Referring to FIG. 4, the transmission enable signal generation circuit 140 may include a shift circuit 410, a phase comparison circuit 430, and a selection circuit 450.

The shift circuit 410 may sequentially delay the signal PRE_TX_EN to generate the plurality of preliminary transmission enable signals TX_EN_Q1 to TX_EN_QN. The shift circuit 410 may include a plurality of D flip-flops 411_1 to 411_N connected in series to one another (N is an arbitrary integer equal to or more than 2). Each of the D flip-flops 411_1 to 411_N may sequentially delay the signal PRE_TX_EN in synchronization with a falling edge of a clock CLK. For example, the D flip-flop 411_3 may delay TX_EN_Q2 to generate TX_EN_Q3. Bubbles of clock terminals of the D flip-flops 411_1 to 411_N may indicate that the D flip-flops 411_1 to 411_N operate in synchronization with the falling edge of the clock CLK. Although in the embodiment described herein the shift circuit 410 includes the plurality of D flip-flops 411_1 to 411_N connected in series to one another and sequentially delays the signal PRE_TX_EN by using the D flip-flops 411_1 to 411_N, this description is for illustrative purposes and other types of delay elements connected in series to one another, other than the D flip-flops 411_1 to 411_N, may also be used.

The phase comparison circuit 430 may compare a phase of a transmission enable signal TX_EN selected by the selection circuit 450 and a phase of the transmission data DATA_TX. The phase comparison circuit 430 may include a phase comparator 431. The phase comparator 431 may enable an early signal EARLY when the phase of the transmission enable signal TX_EN is earlier than the phase of the transmission data DATA_TX, and may enable a late signal LATE when the phase of the transmission enable signal TX_EN is later than the phase of the transmission data DATA_TX.

The selection circuit 450 may select one of the preliminary transmission enable signals TX_EN_Q1 to TX_EN_QN as the transmission enable signal TX_EN in response to the phase comparison result EARLY and LATE of the phase comparison circuit 430. The selection circuit 450 may include a selection code generator 451 and a selector 453.

The selection code generator 451 may change the selection codes SEL<1:N> while monitoring the phase comparison result EARLY and LATE of the phase comparison circuit 430, and then determine the values of the selection codes SEL<1:N> in response to a change in the phase comparison result EARLY and LATE of the phase comparison circuit 430. The selection code generator 451 may monitor the phase comparison result while selecting preliminary transmission enable signals having a gradually higher number, such as TX_EN_Q1, TX_EN_Q2, and TX_EN_Q3. Therefore, when the monitoring result is changed from EARLY='H' to LATE='H', the selection code generator 451 may determine a preliminary transmission enable signal, which has a number lower than the currently selected preliminary transmission enable signal by 1, as a transmission enable signal. As a consequence, the selection code generator 451 may generate substantially the same selection codes as those generated by the selection code generator 251 of FIG. 2. The selection code generator 451 may be enabled to generate the selection codes SEL<1:N> during the training operation period in which the training enable signal T_EN is enabled. Further, the selection code generator 451 may be disabled when the training enable signal T_EN is disabled. The selection code generator 451 may hold the generated selection codes SEL<1:N> as its output when it is disabled. That is, when the training operation ends, the selection code generator 451 may hold the selection codes SEL<1:N> generated during the training operation without performing additional selection operations.

The selector 453 may select one of the preliminary transmission enable signals TX_EN_Q1 to TX_EN_QN in response to the selection codes SEL<1:N> and output the selected preliminary transmission enable signal as the transmission enable signal TX_EN.

Referring to FIG. 4, the selection code generator 451 may generate the selection codes SEL<1:N> for controlling the selection operation of the selector 453. The selector 453 may sequentially select the plurality of preliminary transmission enable signals TX_EN_Q1 to TX_EN_QN from the shift circuit 410 one by one, based on the selection codes SEL<1:N> of the selection code generator 451. The selector 453 may then provide the selected preliminary transmission enable signal to the phase comparison circuit 430. Initially, the selector 453 may select the preliminary transmission enable signal TX_EN_Q1, based on the selection codes SEL<1:N> of the selection code generator 451 to provide the selected signal TX_EN_Q1 to the phase comparison circuit 430. The phase comparison circuit 430 may compare the phase of the preliminary transmission enable signal TX_EN_Q1 with the phase of the transmission data DATA_TX to provide a first comparison result EARLY and LATE to the selection code generator 451. When the first comparison result indicates EARLY='H', the selection code generator 451 may change the selection codes SEL<1:N> such that the selector 453 can select the preliminary transmission enable signal TX_EN_Q2. The phase comparison circuit 430 may compare the phase of the preliminary transmission enable signal TX_EN_Q2 with the phase of the transmission data DATA_TX to provide a second comparison result EARLY and LATE to the selection code generator 451. When the second comparison result indicates EARLY='H', the selection code generator 451 may change the selection codes SEL<1:N> such that the selector 453 can select the preliminary transmission enable signal TX_EN_Q3. The phase comparison circuit 430 may compare the phase of the preliminary transmission enable signal TX_EN_Q3 with the phase of the transmission data DATA_TX to provide a third comparison result EARLY and LATE to the selection code generator 451. In the course of repeatedly performing the process described above on the plurality of preliminary transmission enable signals TX_EN_Q1 to TX_EN_QN, the selector 453 may select the preliminary transmission enable signal TX_EN_QK causing EARLY='H' just before the preliminary transmission enable signal TX_EN_QK+1 causing LATE='H', as the transmission enable signal TX_EN, if it is found that the comparison result indicates LATE='H'.

In the embodiment of FIG. 4, since only one phase comparator 431 is used, it is possible to reduce an area of the transmission enable signal generation circuit 140 as compared with the embodiment of FIG. 2. However, since the transmission enable signal TX_EN is determined by sequentially comparing the phase of each of the preliminary transmission enable signals TX_EN_Q1 to TX_EN_QN with the phase of the transmission data DATA_TX by using the one phase comparator 431, much more time may be required for training as compared with the embodiment of FIG. 2.

Although various embodiments have been described for illustrative purposes, it will be apparent to those skilled in the art that various changes and modifications may be made without departing from the spirit and scope of the invention as defined in the following claims.

What is claimed is:

1. An integrated circuit comprising:
   a data delay circuit suitable for delaying data to generate transmission data;
   a transmission/reception terminal;
   a receiver suitable for receiving reception data, which is transferred to the transmission/reception terminal, in response to a reception enable signal;
   a transmitter suitable for transmitting the transmission data to the transmission/reception terminal in response to a transmission enable signal;
   a shift circuit suitable for generating a plurality of preliminary transmission enable signals by sequentially delaying a signal;
   a phase comparison circuit suitable for comparing a phase of each of the plurality of preliminary transmission enable signals and a phase of the transmission data; and
   a selection circuit suitable for selecting one of the plurality of preliminary transmission enable signals as a transmission enable signal according to a phase comparison result of the phase comparison circuit.

2. The integrated circuit of claim 1, wherein the selection circuit is enabled during a training operation, and wherein the selection circuit holds a selection result acquired during the training operation when the selection circuit is disabled.

3. The integrated circuit of claim 2, wherein the selection circuit comprises:
   a selection code generator suitable for generating a selection code according to the phase comparison result of the phase comparison circuit during the training operation, and holding a value of the selection code generated during the training operation when the training operation is not performed; and
   a selector suitable for selecting one of the plurality of preliminary transmission enable signals as the transmission enable signal in response to the selection code.

4. The integrated circuit of claim 1, wherein the phase comparison circuit comprises:
   a plurality of phase comparators each suitable for comparing the phase of a corresponding signal of the preliminary transmission enable signals, with the phase of the transmission data.

5. The integrated circuit of claim 1, wherein the shift circuit comprises:
   a plurality of D flip-flops connected in series to one another and suitable for sequentially delaying the signal.

6. An integrated circuit comprising:
   a data delay circuit suitable for delaying data to generate transmission data;
   a transmission/reception terminal;
   a receiver suitable for receiving reception data, which is transferred to the transmission/reception terminal, in response to a reception enable signal;
   a transmitter suitable for transmitting the transmission data to the transmission/reception terminal in response to a transmission enable signal;
   a shift circuit suitable for generating a plurality of preliminary transmission enable signals by sequentially delaying a signal;
   a selector suitable for selecting one of the plurality of preliminary transmission enable signals as the transmission enable signal in response to a selection code;
   a phase comparison circuit suitable for comparing a phase of the transmission enable signal with a phase of the transmission data; and a selection code generator suitable for generating the selection code in response to a phase comparison result of the phase comparison circuit.

7. The integrated circuit of claim 6, wherein the selection code generator changes a value of the selection code to control the selection operation of the selector based on the changed selection code and determines the value of the selection code in response to a change in the phase comparison result of the phase comparison circuit during a training operation, and wherein the selection code generator holds the value of the selection code determined during the training operation when the training operation is not performed.

8. The integrated circuit of claim 6, wherein the phase comparison circuit comprises:
   a phase comparator configured to the phases of the transmission enable signal and the transmission data with each other.

9. The integrated circuit of claim 6, wherein the shift circuit comprises:
   a plurality of D flip-flops connected in series to one another and suitable for sequentially delaying the signal.

* * * * *